United States Patent [19]

Gay et al.

[11] Patent Number: 5,467,455
[45] Date of Patent: Nov. 14, 1995

[54] DATA PROCESSING SYSTEM AND METHOD FOR PERFORMING DYNAMIC BUS TERMINATION

[75] Inventors: James G. Gay, Pflugerville; William B. Ledbetter, Jr., Austin, both of Tex.

[73] Assignee: Motorola, Inc., Schaumburg, Ill.

[21] Appl. No.: 145,117

[22] Filed: Nov. 3, 1993

[51] Int. Cl.⁶ .............................. G01R 27/00; H03H 7/40
[52] U.S. Cl. ........................ 395/281; 333/32; 333/17.3; 395/822
[58] Field of Search ................ 395/325; 333/17.3, 333/22 R, 32

[56] References Cited

U.S. PATENT DOCUMENTS

| | | | |
|---|---|---|---|
| 3,435,375 | 3/1969 | Miller | 331/110 |
| 3,854,057 | 12/1974 | Williams et al. | 330/17.13 |
| 4,567,385 | 1/1986 | Falater et al. | 307/443 |
| 4,695,740 | 9/1987 | Carter | 307/242 |
| 4,761,647 | 8/1988 | Hallenbeck et al. | 340/825.22 |
| 4,791,322 | 12/1988 | Graham et al. | 307/475 |
| 4,806,802 | 2/1989 | Okitaka et al. | 307/542 |
| 4,839,537 | 6/1989 | Ueno | 307/446 |
| 4,853,560 | 8/1989 | Iwamura et al. | 307/296.1 |
| 4,877,978 | 10/1989 | Platt | 307/473 |
| 4,975,598 | 12/1990 | Borkar | 307/443 |
| 5,039,874 | 8/1991 | Anderson | 307/270 |
| 5,057,783 | 10/1991 | Gubisch | 324/710 |
| 5,059,830 | 10/1991 | Tokumaru et al. | 307/481 |
| 5,063,308 | 11/1991 | Borkar | 307/443 |
| 5,162,672 | 11/1992 | McMahan et al. | 307/443 |
| 5,294,845 | 3/1994 | McMahan et al. | 307/443 |

*Primary Examiner*—Jack B. Harvey
*Assistant Examiner*—Jeffrey K. Seto
*Attorney, Agent, or Firm*—Keith E. Witek

[57] ABSTRACT

A data processing system and a method for performing dynamic bus signal termination uses a dynamic bus termination circuitry (14 or 16) with a device (10 or 12). The circuitry is enabled when data is incoming to the device and is disabled when data is outgoing from the device to selectively reduce unwanted signal reflection at the signal end of a bi-directional bus (17). The disabling allows the circuitry to be removed or tristated from any connection with the bus (17) when not needed (i.e., data outgoing) to reduce loading. The disabling of the termination circuitry also aids in reducing the power consumption of the part when either the bus is sitting idle or the part is in a low power mode of operation.

29 Claims, 7 Drawing Sheets

DATA PROCESSING SYSTEM AND METHOD FOR PERFORMING DYNAMIC BUS TERMINATION

FIELD OF THE INVENTION

The present invention relates generally to data processors, and more particularly, to dynamic termination of conductive bus lines to avoid signal reflection.

BACKGROUND OF THE INVENTION

It is known in the art that devices operating at high speeds, devices operating at high clock frequencies, and/or devices which require extremely long conductive interconnections suffer from a performance-reducing phenomenon referred to as a known and understood signal reflection or transmission line effect problem. If a zero volt signal is changed to a five volt signal, for example, on a conductor or bus which is either long in length or operating at a fast edge rate, if the bus or conductive line is not properly terminated via an impedance, the conductive line or bus will take time to settle to the 5 volt value from the 0 volt value due to one or more reflections off one or both ends of the bus. To reduce signal reflection and thereby improve performance, permanent resistors have been placed at the ends of uni-directional buses to reduce signal reflection. This uni-directional termination is easy to do since only one end of the bus is ever receiving data (the other end is always sending) and therefore termination of the receiving side is all that is required. Unfortunately, if the bus is idle or the part is in a low power mode of operation, the connected permanent resistor usually caused increased power consumption which is disadvantageous.

In a bi-directional bus, the termination problem is enhanced because either end of the bus may either be receiving or transmitting at any time. Therefore, in the prior art, permanent resistor termination is placed at both ends of the bus and are connected regardless of whether or not they are needed. This results in an increased load to the bus and increased power consumption when the bus is placed into a low power mode of operation.

SUMMARY OF THE INVENTION

The previously mentioned disadvantages are overcome and other advantages achieved with the present invention. In one form, the present invention comprises a method for determining whether to enable termination circuitry within a data processor. A bus transfer begins through a bus coupled between the data processor and a device external to the data processor. A determination is made as to whether the data processor is receiving data or sending data external to the processor. The termination circuitry is enabled if the data processor is receiving data from the bus in order to reduce signal reflection on the bus. The termination circuitry is disabled if the data processor is sending data through the bus.

In another form, the invention comprises a data processing system having a communication device having at least one external pin connected external to the communication device. The at least one external pin is coupled to receive data from external to the communication device and transmit data external to the communication device. The communication device has circuitry for terminating. The circuitry for terminating has a first input/output terminal coupled to the at least one external pin via at least one data line. The circuitry for terminating has a second input/output terminal for providing or receiving data from internal to the communication device. The circuitry for terminating has an input for receiving an enable signal and has one or more termination component(s). The enable signal couples the termination component to the at least one termination pin when the enable signal is asserted, and decouples the termination component from the at least one termination pin when the enable signal is deasserted.

The present invention will be more clearly understood from the detailed description below in conjunction with the accompanying drawings.

It will be appreciated that for simplicity and clarity of illustration, elements illustrated in the FIGURES have not necessarily been drawn to scale. For example, the dimensions of some of the elements are exaggerated relative to other elements for clarity. Further, where considered appropriate, reference numerals have been repeated among the FIGURES to indicate corresponding or analogous elements.

DESCRIPTION OF A PREFERRED EMBODIMENT

In general, the apparatus and method illustrated herein is designed to dynamically enable the proper termination inside a receiver at the end of the bi-directional bus. The proper termination is dynamically connected to the bus only when data is being received in order to reduce signal reflection on the bus (i.e. transmission line effects) and allow for a more rapid operational speed. This dynamic bus termination requires a control signal which indicates to the receiving device the current drive direction of the bus (i.e., is data being read from the device or is data being written to the device). When this control signal indicates the bus has a voltage and/or current which is being driven into the receiving device, the receiving device turns on its termination devices to dampen the incoming signal so no reflections are sent back down the bus (transmission line). When the control signal indicates the bus is not being driven into the receiving device the receiving device's terminators are turned off to reduce the load on the bus and power dissipation of the bus.

An example of devices which would use this dynamic termination method would be two very high speed processors which communicate through a bi-directional bus such as a data bus. For this case, the control signal that switches on the receiving processor's termination network would be the read/write (R/W*) line. It is advantageous to use a control line which will indicate the directionality of the bus in advance of the time when the data is actually transferred to allow receiving devices time to enable their respective termination networks. It should be noted that other bus termination control signals may be used to form a termination enable signal herein (the other termination control signals being signals other than the R/W* line or a master/slave* control signal).

R/W* is driven by a processor or primary bus master when the processor is the bus owner (i.e., when the processor has mastership or ownership of the bus). The R/W* signal indicates the direction (i.e., data going into the primary master [a read] or data going out of the primary master [a write]) of subsequent data transfer(s). It is asserted high during read bus cycles and asserted low during write bus cycles. When the primary master is not the bus master, the R/W* signal is tristated. The '*' character in a signal name implies that the signal is active low in some manner. The external resistor 11 is used to stabilize the R/W* line when the R/W* line is tristated by devices 10 and 12.

The preferred method and apparatus illustrated and taught herein solves the problem of properly terminating a bi-directional transmission line. Known techniques involved terminating a bus at each end of the bus, at mid-points on the bus, or involve structuring the bus in a star-like layout with the termination network at the center of the star. There are various known performance disadvantages that occur when using a static termination on both ends or mid-point of a bus. When allowing a termination network to be dynamically switched into or out of a transmission line network to place the proper termination at the end or final receiver on the bus as required, performance is improved.

Specifically, the apparatus and method illustrated herein provides the ability to dynamically terminate a bi-directional bus depending on the current bus drive direction. Since this method allows the termination network to appear where needed at the end point of the net, the transmission line can be properly terminated as if it was a uni-directional bus. This method of termination also reduces power used in the termination networks of a system since only those termination networks which are at the endpoint of the bus need be enabled. When a device drives a high speed bi-directional bus, the transmission line should be properly terminated at the terminal point of the net, which is usually the input of another device, to prevent signal reflection problems. However, when another device on the bi-directional bus drives the signal the proper place for the termination could be at the other end or a different point of the net, usually another input device. Depending on the drive characteristics of the various device drivers on the bus, a different termination method/circuit or component value (e.g., different resistances) may be required to properly terminate the transmission line.

Figure 1:
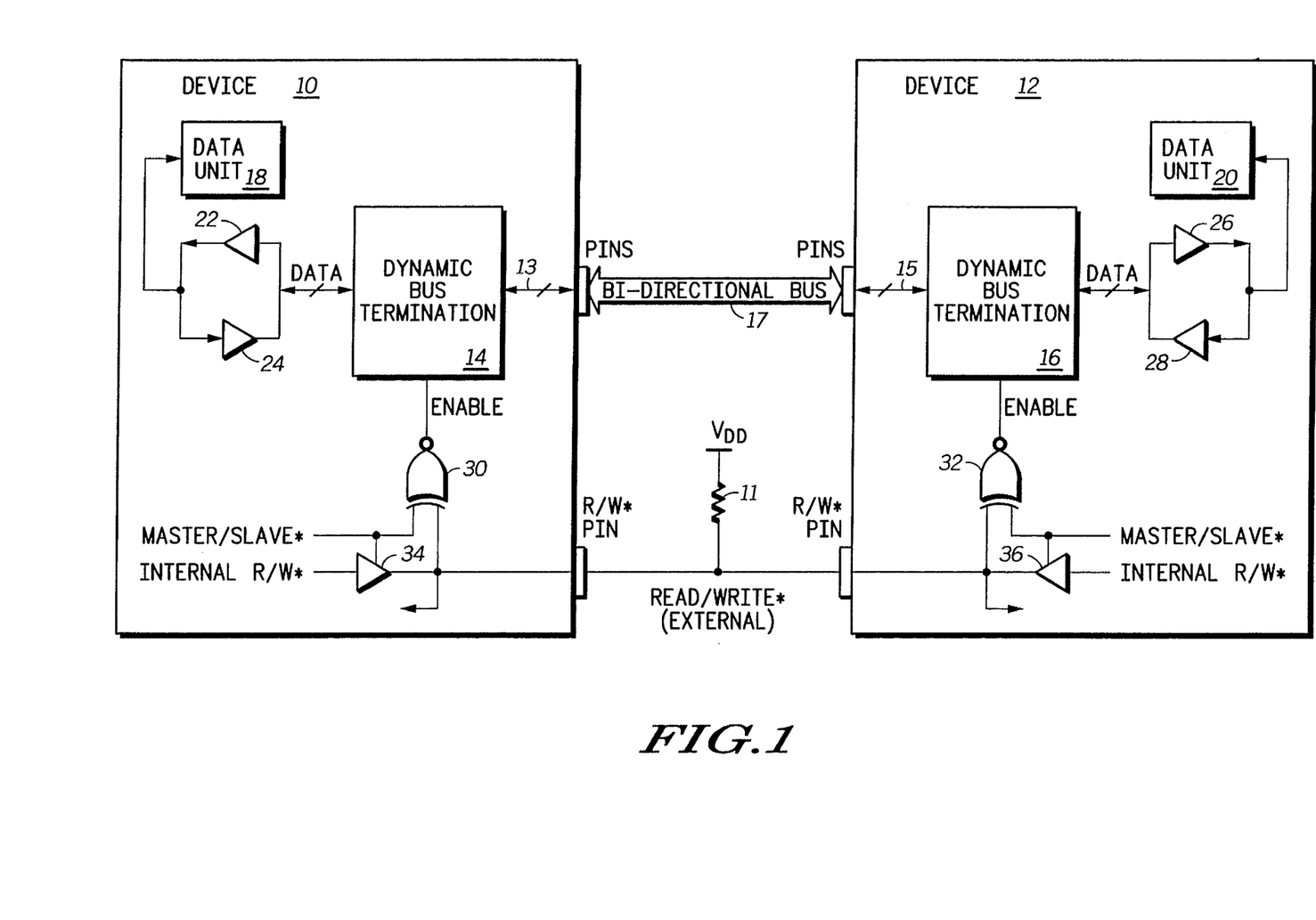
FIG. 1 illustrates, in a block diagram, a data processing system in accordance with the present invention.

The invention can be further understood with reference to the FIGS. 1–7. FIG. 1 illustrates a data processing system. The data processing system has a device 10 and a device 12 (referred to also as communication devices since they communicate to one another). Generally, device 10 and device 12 are each integrated circuits. For example, either device 10 or device 12 may be a memory device (such as a SRAM, a DRAM, a EEPROM device, an EPROM device, a flash device, and the like), an interface device, any peripheral device, a DMA device, a communication device, a timer, analog circuitry, a microprocessor, a pipelined execution device, an application specific integrated circuit (ASIC) device, a programmable logic array (PLA), hard-wired logic, an execution unit at least partially software driven by microcode and/or nanocode, a plurality of execution devices, a digital signal processor (DSP), a computer, a data processor, a central processing unit (CPU), and integrated circuit, and/or the like.

The device 10 has a dynamic bus termination circuit 14 connected via at least one conductor or a bi-directional bus 13 to one or more external integrated circuit data pins. An internal data bus connects the circuit 14 to a bi-direction circuit having a first tristate buffer 22 and a second tristate buffer 24. Buffers 22 and 24 are turned on, usually in a mutually exclusive manner to enable bi-directional communication (time-multiplexed two-way communication). The buffers 22 and 24 are connected to a data unit 18 which may be a memory array or a data processor CPU. In another form the internal data bus may be split into two buses, one bus for reading and one bus for writing wherein no time multiplexing is needed until the external pins are reached.

The termination circuit contains one or more circuit components which when coupled to the data line reduce reflection or change line impedance on the bi-directional external bus 17 when data is being received by the device 10. The circuit components may include one or more of a capacitor, a PN junction, a diode, a resistor, a resistive device, an inductor, an N channel transistor, a P channel transistor, a junction field effect transistor (JFET), a metal oxide semiconductor transistor (MOSFET), a bipolar device, a Bi-CMOS device, a current source, a voltage source, any other like termination component, or a circuit comprising one or more of the circuit elements listed above.

The circuit component within circuit 14 is coupled to the pins in response to the state of an enable control signal of FIG. 1. The enable signal, in general, is in one logic state if a data is incoming to the device 10 and is deasserted when data is being sent out from the device 10. In one form, the enable signal is a function of the read/write R/W* and a mater/salve* control signal which indicates whether device 10 is a master of the bus 17 or a slave device not having ownership/mastership of bus 17. The logic involves a tristate buffer 34 and a exclusive nor (XNOR) gate 30.

The device 12 has a dynamic bus termination circuit 16, a bus 15, a internal bi-directional data bus with tristate buffers 26 and 28, a data unit 20, an XNOR gate 32, a tristate buffer 36, a master/slave* signal, and a R/W* signal all of which are analogous to corresponding elements in device 10. It is important to note that although device 10 is analogous to device 12 in FIG. 1 that the device 12 could be very different from device 12 in another form. For example, device 12 could be a memory device wherein device 10 is a microprocessor. Device 12 may not have enable logic similar to device 10 (i.e., may not have the XNOR 32 and tristate buffer 36, but other logic and other control signal inputs).

The operation of the dynamic termination may be further described as follows. Assume device 10 is a bus master and device 12 is a slave device for purposes of a data transfer on bus 17. Furthermore, assume device 10 desires to make a write transfer of data to device 12. Device 10 has an internal indication that it is master of the bus 17 while device 12 has internal indication it is currently a slave on the bus 17. Device 10 will assert and drive the Read/Write* (R/W*) line via an enabled tristate buffer 34 to indicate it desires a write transfer of data to device 12. In this case, Device 10 has inputs to the exclusive-NOR (XNOR) gate 30 which are at a logical 1 and 0 causing the termination network to be disabled. In other words, the termination circuitry of device 10 is disabled because data is outgoing not incoming, and therefore no termination in device 10 is needed to avoid transmission line effects and/or signal reflection. However, device 12 has inputs to the exclusive-NOR (XNOR) gate 32 are both at a logic 0 level causing the termination network in device 12 to be enabled. The termination in device 12 is enabled because device 12 is receiving data on bus 17. Thus, when device 10 asserts and drives data out onto the bus 17 to be received by device 12, the data bus transmission line 17 is dynamically and properly terminated with the characteristic impedance of the line preventing signal reflection problems.

Assuming the same mastership assignments from the above example, but for a read access, device 10 will assert and drive the R/W* line to indicate it desires a read transfer of data from device 12. For this case, device 10 has inputs to the exclusive-NOR gate which are both at a logical 1 causing it's termination network to be enabled. However, Device 12 has inputs to the exclusive-NOR gate which are at a logical 0 and 1 causing the termination network in Device 2 to be disabled. Thus, depending on the direction of the data transfer and mastership assignments, either device 10 or device 12 has a termination network which will be dynamically enabled providing transmission line termination at the end or sink of the bus 17 lines.

The advantage in using this mechanism is that a termination network is allowed to be dynamically enabled and present at the end receiver of a bus to properly and exactly terminate the bi-directional transmission line. Additionally, and just as important, this invention allows the termination network to be disabled or not present when the device is not receiving data to reduce power dissipation and reduce the loading of bus lines. This method of termination reduces power used in the termination networks of a system since only those termination networks which are at the endpoint of the bus need be enabled at any given time. When a bus is not being used at all, neither of the circuits 14 or 16 are enabled which further decreases power consumption.

Figure 2:
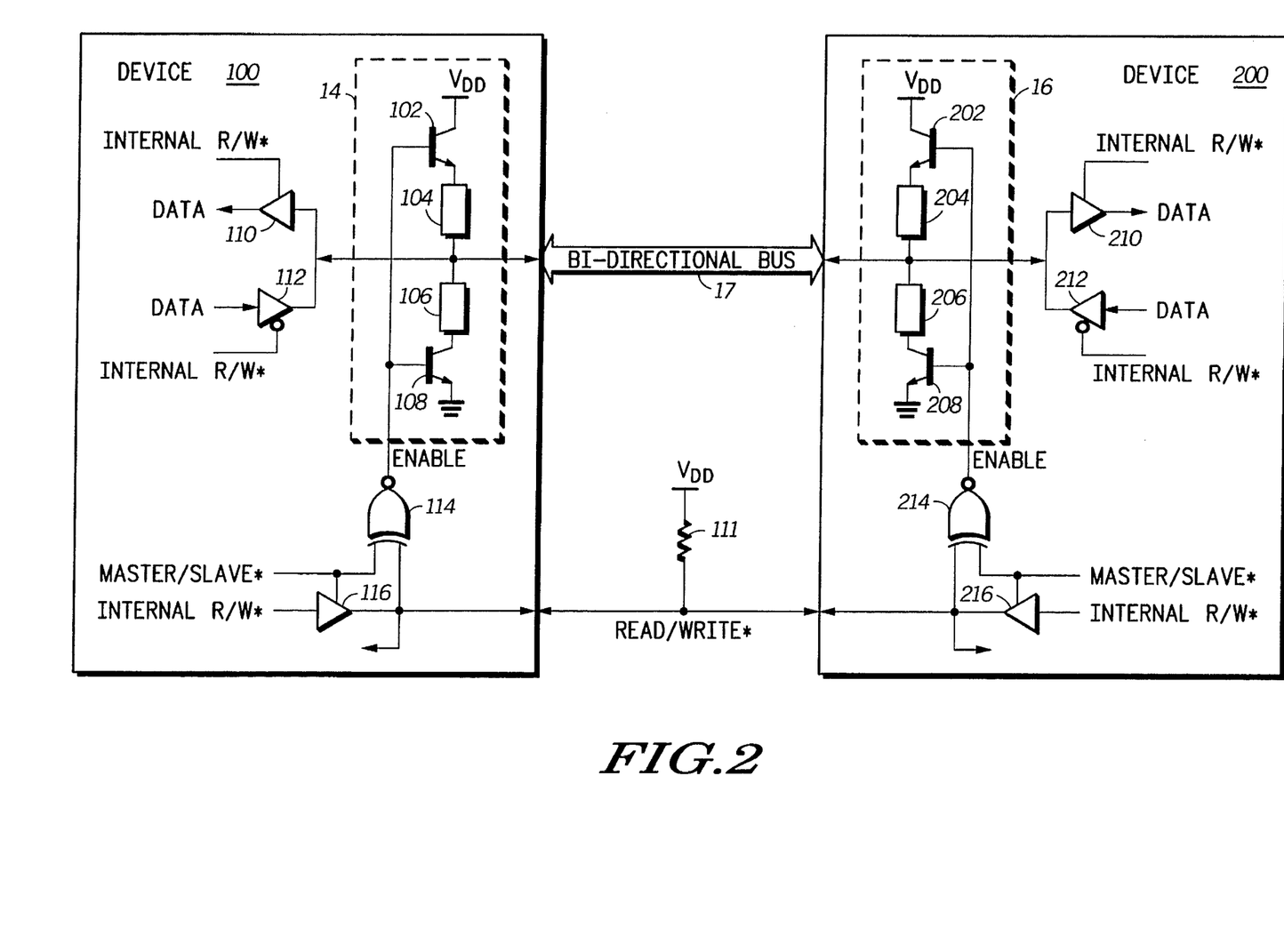
FIG. 2 illustrates, in a block diagram, another data processing system in accordance with the present invention.

FIG. 2 illustrates a data processing system similar to FIG. 1 but further illustrates the circuits 14 and 16 of FIG. 1. The device 100 is analogous to the device 10, and the device 200 is analogous to the device 12. Integrated circuit pins are not illustrated in FIG. 2 although they are present in a preferred form. The tristate buffers 110, 112, 210, and 212 are respectively analogous to the tristate buffers 22, 24, 26, and 28 of FIG. 1. The tristate buffers, 110, 112, 210, 212 are enabled/disabled via a control signal R/W* (internal) and controls the direction of data flow on the bus 17. Resistor 111 is analogous to resistor 11 of FIG. 1. The XNOR gates 114 and 214 are analogous to the XNOR gates 30 and 32, respectively, of FIG. 1. The tristate buffers 116 and 216 are respectively analogous to tristate buffers 34 and 36 of FIG. 1.

The circuits 14 and 16 are analogous within FIG. 2 therefore only the circuit 14 of device 100 in FIG. 2 is discussed in detail below. This discussion should serve to fully explain the device 200 as well. FIG. 2 illustrates that circuit 14 contains a bipolar transistor 102 and a bipolar transistor 108. Transistor 102 has a collector coupled to Vdd (usually 5.0 volts or less), an emitter, and a base connected to the enable signal. A circuit component 104, used to dynamically reduce signal reflection, has a first terminal connected to the emitter of transistor 102 and a second terminal connected/coupled to the bus 17 (output buffers, input buffers, and input/output (I/O) buffers, as needed, are not specifically illustrated in FIGS. 1–2). The transistor 108 has an emitter connected to a ground potential, a collector, and a base connected to the enable signal. A component 106, similar to component 104, has a first terminal connected/coupled to the bus 17 and a second terminal connected to the collector of transistor 108.

The components 104 and 106 may each be, for example a single resistor. In other forms, the components 104 and 106 may be entire circuits comprising logic gates, capacitors, PN junctions, diodes, other resistors, any resistive devices, inductors, N channel transistors, P channel transistors, JFET, bipolar transistor devices, BiCMOS devices, and the like. The components 104, 106 are dynamically activated to the bus 17 only when data is being received by the device 100 via the bus 17. The components 104 and 106 are selectively connected via the enable signal connected to the transistors 102 and 108. It should be noted again that other termination methods besides the thevenin-equivalent method taught herein with resistors etc. are possible. The point of interest is the concept of making the termination dynamic at end points of a bi-directional bus, whereas different termination may be used for each device in the data processing system.

As stated previously, the transistors 202 and 208 and the devices 204 and 206 are analogous to elements discussed above in for device 100.

Figure 3:
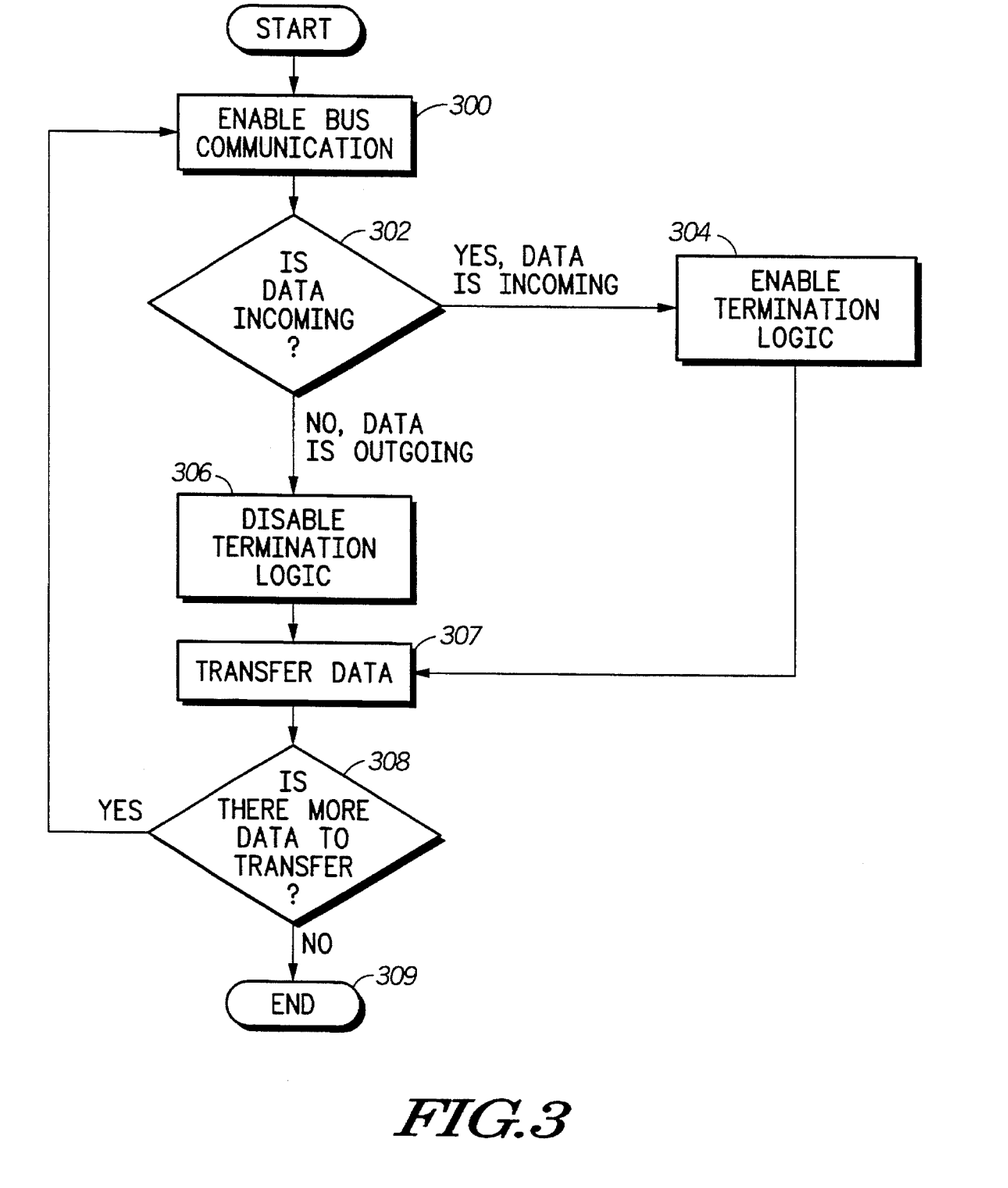
FIG. 3 illustrates, in a flowchart, a method for dynamically enabling a termination circuit of an integrated circuit in accordance with the present invention.

FIG. 3 illustrates a method used to dynamically terminate an integrated circuit. In a step 300, bus communication is enabled or initiated. In a step 302, a device coupled to a bus, such as device 10 of FIG. 1, determines whether data is incoming from the bus to the device or outgoing from the device to the bus. If the data is incoming a step 304 is used to enable the termination logic in FIGS. 1–2. If the data is outgoing, no termination is needed and the termination circuitry is disabled. Once the termination circuitry is either disabled or enabled, the data is transferred with reduced signal reflection along the bus. If there is more data to transfer, the method of FIG. 3 is performed again via a step 308. In a step 309 the termination components/circuits are disabled if not needed. The above method will work for any type of bus transfer including burst bus transfers wherein multiple data values are sent in a single bus cycle.

Figure 4:
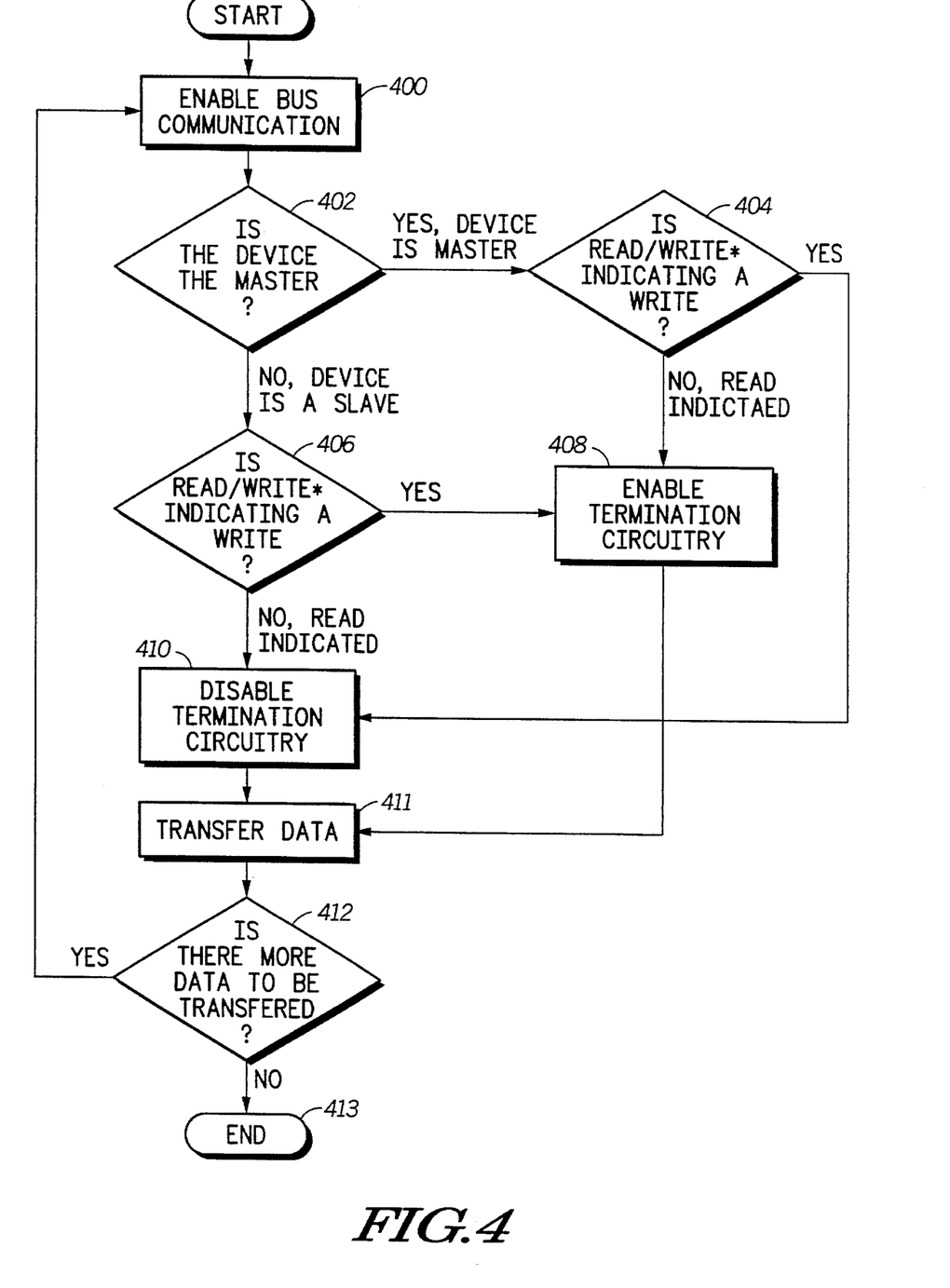
FIG. 4 illustrates, in a flowchart, another method for dynamically enabling a termination circuit of an integrated circuit in accordance with the present invention.

FIG. 4 illustrates an alternative method of for performing dynamic termination. In general, FIG. 4 is similar to FIG. 3. A step 400 is analogous to step 300 in FIG. 3. A step 402 is used to determine if the device is a master device (i.e., has ownership of the bus being used to communicate information). Steps 404 and 406 are used to determine if a read or a write operation is occurring. Based upon the state of master/slave* in step 402 and the R/W* signal in steps 404 and 406, the termination circuitry is either enabled or disabled in steps 408 or 410. Data is transferred in a step 411 with reduced signal reflection on the bus and if more data is to be transferred, the process of FIG. 4 is repeated as illustrated in step 412. In a step 413, the transfer termination circuits/components are disabled if not needed. In general, the state diagram of master/slave* and R/W* used to determine whether or not the termination circuitry is enabled is as follows:

| R/W* | master/slave* | termination enabled? |
| --- | --- | --- |
| 0 | 0 | yes |
| 0 | 1 | no |
| 1 | 0 | no |
| 1 | 1 | yes |

Figure 5:
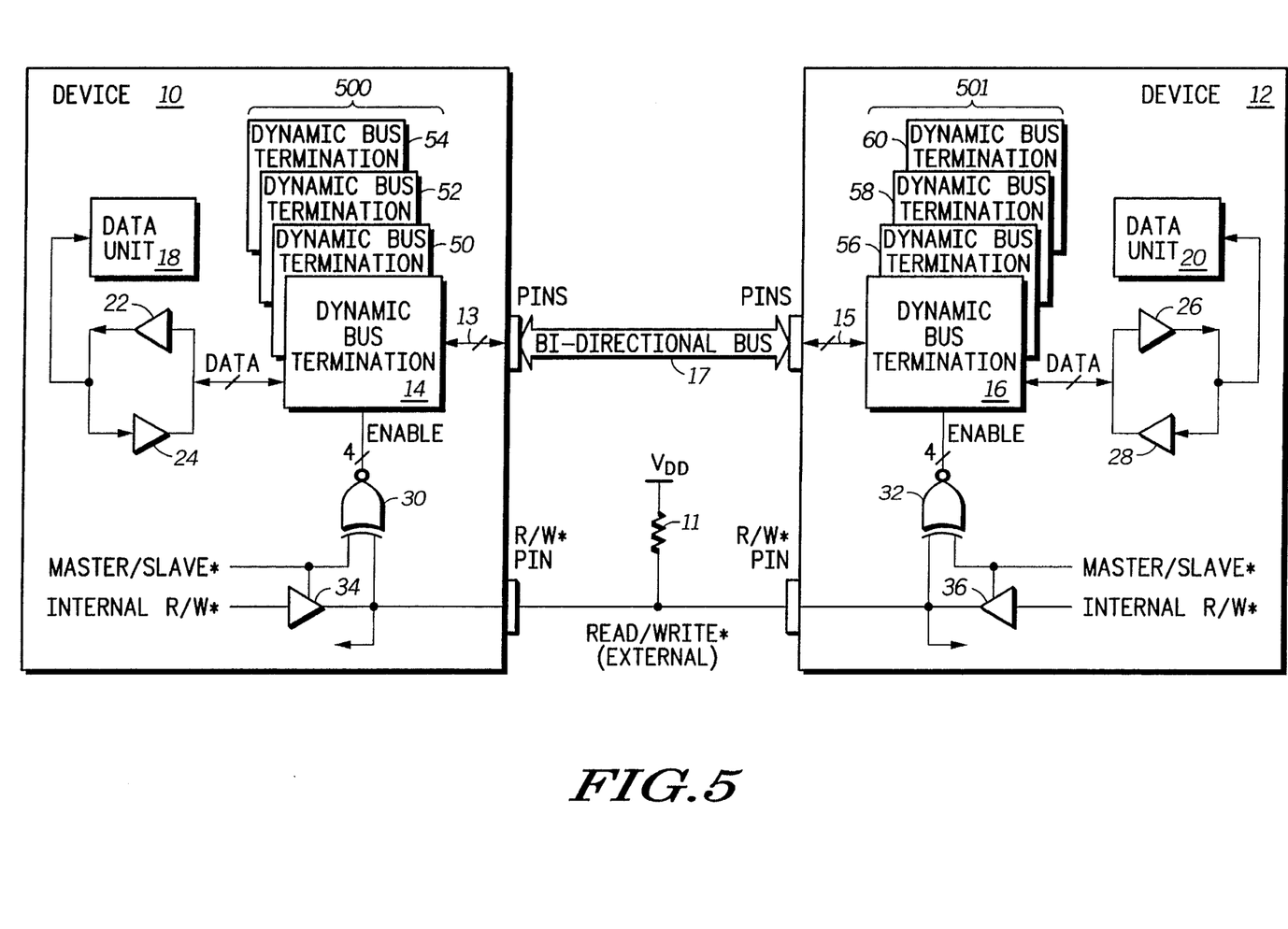
FIG. 5 illustrates, in a block diagram, a data processing system having a plurality of independently-enabled bus termination circuits for each external input/output integrated circuit pin in the data processing system being in accordance with the present invention.

FIG. 5 illustrates a system similar to FIG. 1. All the elements of FIG. 1 which are analogous to elements in FIG. 5 are identically labeled. One significant different between FIG. 1 and FIG. 5 is that FIG. 5 illustrates termination circuits 500 and 501. The termination circuit 500 contains, in FIG. 5, four dynamic bus termination circuits 14, 50, 52, and 54. It should be noted that any number of bus termination circuits may be included within circuit 500. In general, N dynamic bus termination circuits may be serially connected and/or parallel-connected together in the circuit 500 wherein N is a finite integer greater than zero (i.e., 1, 2, 3, 4, 5, 6, . . . dynamic bus termination circuits may be used). Each of the bus termination circuits in circuit 500 have different enable signals, therefore four enable signals are illustrated in FIG. 5. When termination is desired, one or more of the enable signals may be enabled to connected one or more termination components/circuits to the bus to reduce signal reflection or alter line impedance. The enables may be derived internally to the device 10, may be received from external to the device 10 (i.e., from a slave device or alternate master), or may be a combination of signals internal and external to the device 10. Circuit 501 is similar to circuit 500 and is therefore not further discussed.

The system of FIG. 5 is useful if different termination circuits are required at different times, or for different device speeds, or when device 10 is interfacing with different external devices. For example, circuit 14 may be enabled when the device 10 operates at 33.3 Mhz and circuit 50 enabled when the device 10 operates at 50 MHz, etc. The circuit 52 may be enabled when the device is communicating to a slow SRAM device, whereas termination circuit 54 is enabled when communicating to a fast DRAM device, etc. In other cases, two or more of the circuits 14, 50, 52, and 54 may be simultaneously enabled to couple a plurality of termination components or circuits in either parallel or series or a combination of parallel and series. Note that bus 13, the bi-directional bus, and the data bus may be either one bit or more than one bit. If they are more than one bit, then circuit 500 is repeated for each bit of the bus, as in FIG. 1.

Figure 6:
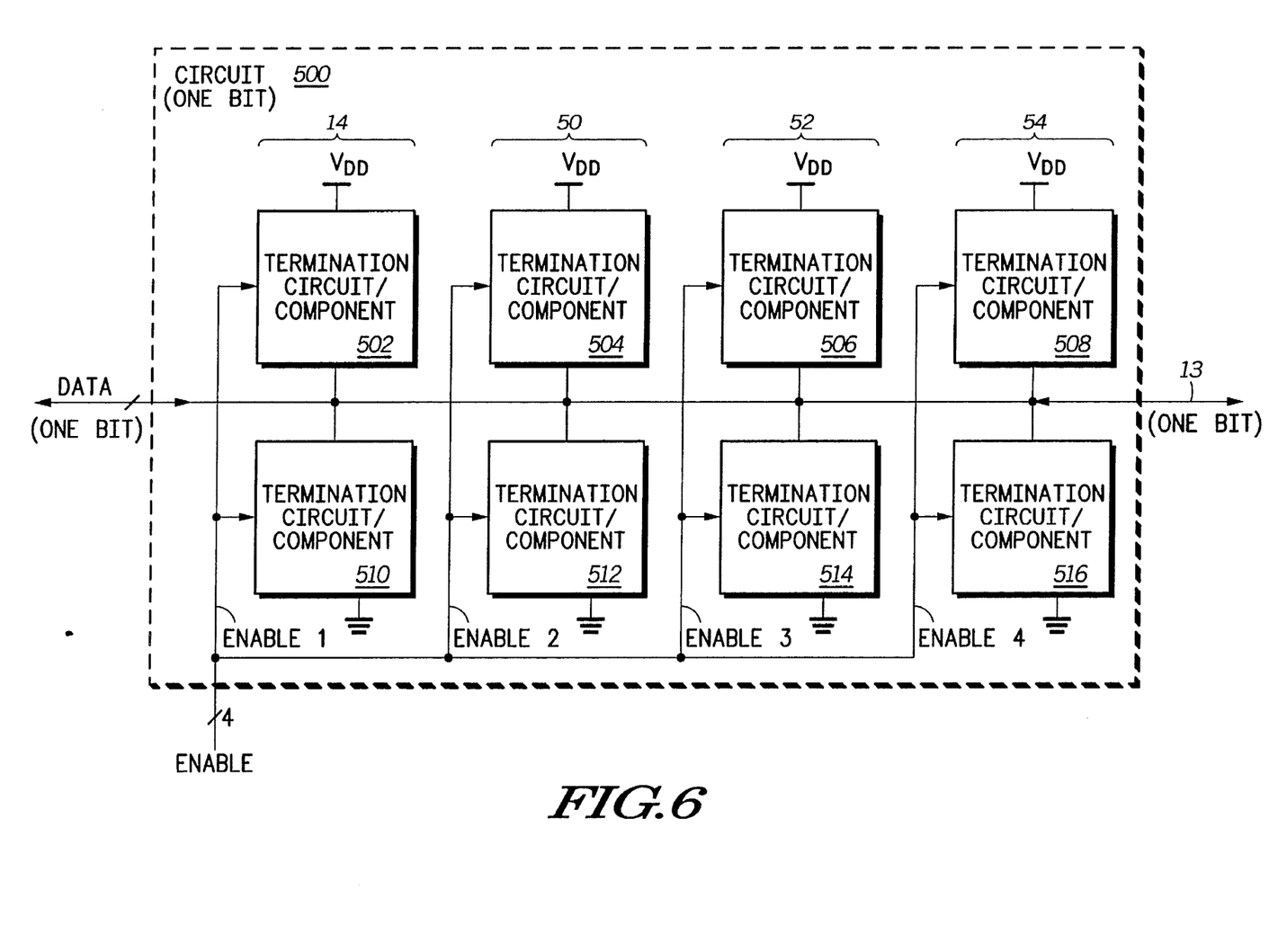
FIG. 6 illustrates, in a block diagram, an interconnection of the plurality of independently-enabled bus termination circuits of FIG. 5 in accordance with the present invention.

For example, FIG. 6 illustrates the circuit 500 including the four termination circuits 14, 50, 52, and 54. The bus 13, the data bus and four enable lines of FIG. 5 are illustrated. The 4 enable circuits are split internal to circuit 500 into separately-labeled enable signals 1 through 4. Each termination circuit must have a device which functions as an on/off switch (i.e. a bipolar transistor, an MOS transistor, a JFET, an SCR, a triac, a relay, etc.) and a device which functions to change the impedance of the bus or to reduce signal reflection. The function of switching and reducing reflection may be performed by a single device, such as a single transistor in the circuit/components of FIG. 6.

Termination circuit 14 has a termination circuit/component 502 coupled between the bi-directional bus and Vdd, and a termination circuit/component 510 coupled between the bi-direcitonal bus and ground. Termination circuit 50 has a termination circuit/component 504 coupled between the bi-directional bus and Vdd, and a termination circuit/component 512 coupled between the bi-direcitonal bus and ground. Termination circuit 52 has a termination circuit/component 506 coupled between the bi-directional bus and Vdd, and a termination circuit/component 514 coupled between the bi-direcitonal bus and ground. Termination circuit 54 has a termination circuit/component 508 coupled between the bi-directional bus and Vdd, and a termination circuit/component 516 coupled between the bi-direcitonal bus and ground.

If enable 1 is asserted and all other enables are deasserted, then only circuits/components 502 and 510 are coupled to the bi-directional bus. If enables 1 and 2 are asserted while all other enables are deasserted then circuit/component 502 is in parallel with circuit/component 504 and circuit/component 510 is in parallel with circuit/component 512 to form a different termination device.

For example, assume circuit/component 502 is a 100 ohm resistor and a switch, circuit/component 504 is a 50 ohm resistor and a switch, circuit/component 506 is a 10 ohm resistor and a switch, and circuit/component is a 3 ohm resistor and a switch for sake of example. If the switches are coupled to the enable signals, then the four enables can cycle through 16 ($2^4$) different states. In these 16 different states one of either 100, 50, 10, 3, 33.33, 8.33, 2.91, 7.69, 2.75, 2.16, 9.09, 2.30, 2.83, 2.20, 2.26, or ∞ ohms can be selectively chosen as the impedance of the bus from the bi-directional bus to the Vdd line in the circuit of FIG. 6. In another form, eight enable signals may be used in FIG. 6 wherein one enable signal is coupled to each termination circuit/component of FIG. 6. With eight enables $2^8$ distinct termination values are possible.

Figure 7:
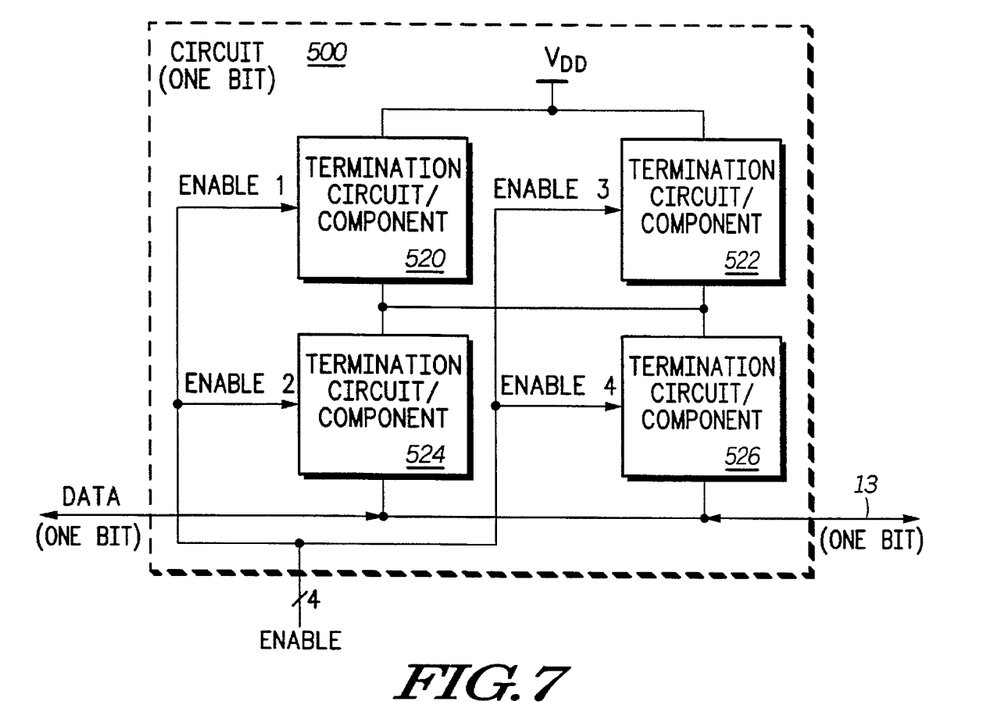
FIG. 7 illustrates, in a block diagram, another interconnection of the plurality of independently-enabled bus termination circuits of FIG. 5 in accordance with the present invention.

FIG. 7 illustrates an alternative interconnection of circuits/components 520, 522, 524, 526. Once again, the circuits/components of FIG. 7 are similar to the circuits/components of FIG. 6 wherein at least one device functioning as an on/off switch and a signal reflection reducer must be present, or multiple devices wherein the multiple device either together or in isolation perform the switching function and the reflection reducing function. FIG. 7 illustrates that serial connections as well as parallel connections may be made via the interconnection of circuit 500. Four enable signals are illustrated. The various states of enable signals in FIG. 7 result in up to 9 distinct termination values. For example, assume that circuit/component 520 is a 5 ohm resistor and a serial switch, circuit/component 522 is a 10 ohm resistor and a serial switch, circuit/component 524 is a 20 ohm resistor and a serial switch, and circuit/component 526 is a 50 ohm resistor and a serial switch. The following termination impedances may result: 60, 55, 30, 25, 53.333, 23.333, 24.286, 19.286, and ∞ ohms depending on the states of the enable signals. FIG. 7 also illustrates that the termination circuits in FIGS. 1–7 do not always have to be coupled to both ground and Vdd. Instead a termination circuit/component may connect/couple only to either Vdd or ground.

Figure 8:
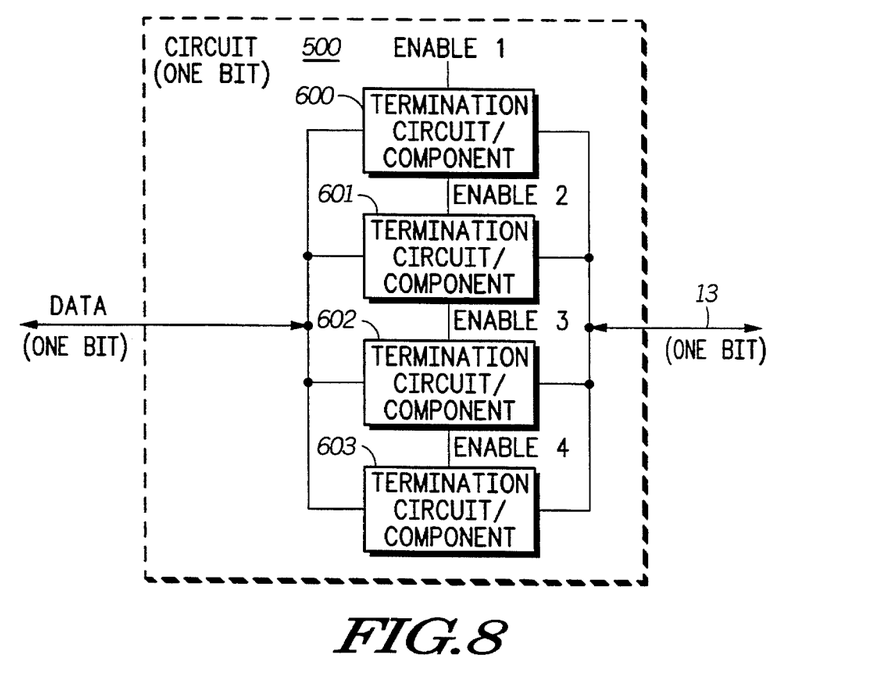
FIG. 8 illustrates, in a block diagram, yet another interconnection of the plurality of independently-enabled bus termination circuits of FIG. 5 in accordance with the present invention.

FIG. 8 illustrates a circuit 500 which may be used to selectively couple destination series termination in series with a bus 13. FIG. 8 illustrates four termination circuits/components 600, 601, 602, and 603 which are respectively enabled via enables 1–4. It should be noted that any number of termination circuits and components (not just four) may be connected as illustrated in FIG. 8. The enables 1–4 may be independently asserted or asserted in groups to provide up to 16 different termination combinations for the four termination circuits/components in FIG. 8. One of the termination circuit/components may be a direct electrical short circuit.

While the present invention has been illustrated and described with reference to specific embodiments, further modifications and improvements will occur to those skilled in the art. For example, more than two devices connected to the bus, more than two masters, and/or more than two states may be coupled to a bus in FIGS. 1–2. Either address buses, data buses, serial communication lines, or control signals may be terminated in the manner taught herein. Any termination circuit or component which reduces signal reflection may be used. An RC network may also be useful as a termination component/circuit. It is also advantageous to enable the termination component only during a brief time when data is actually transitioning on a bus. Furthermore, the data bus may have 32 bits wherein a new transfer changes the bus (for example, from an FFFFFFFF hex value to an FFFFFFF7 hex value) wherein only one bit in the 32-bit value is changing significantly. In this case only one termination circuit in the 32 termination circuits need be enabled to reduce reflection. It is also important to note that the proper termination value for a bus could be a series-connected resistance (series connected meaning that it is connected in-line with the bus in-between the receiving pin and an input buffer). The configuration of the circuits of FIG. 5 may be set upon reset, externally-configurable, or may be user configurable. Other enable control signals are possible besides the enables illustrated herein. The structures and methods taught herein may be used for both bi-directional buses or uni-directional buses. It is to be understood, therefore, that this invention is not limited to the particular forms illustrated and that it is intended in the appended claims to cover all modifications that do not depart from the spirit and scope of this invention.

What is claimed is:

1. A data processing system having a communication device, the communication device being an integrated circuit having a plurality of external pins, the plurality of external pins being coupled to receive data from external to the communication device and transmit data external to the communication device, the communication device comprising:

circuitry for signal termination having a plurality of first input/output terminals coupled to the plurality of external pins via a plurality of data lines, the circuitry for signal termination having a second input/output terminal for providing data to or receiving data from internal to the communication device, the circuitry for signal termination having an input for receiving an enable signal from either internal or external to the communication device and having a termination component, the enable signal allowing the circuitry for signal termination to couple the termination component to the plurality of external pins when the enable signal is asserted and decoupling the termination component from the plurality of external pins when the enable signal is deasserted.

2. The data processing system of claim 1 wherein the circuitry for signal termination reduces signal reflection of a voltage signal input from the plurality of external pins when the enable signal is asserted.

3. The data processing system of claim 1 further comprising:

a multi-bit bi-directional bus coupled to the plurality of external pins for communicating either address or data information within the data processing system.

4. The data processing system of claim 3 wherein the data bus is coupled to a plurality of communication devices, the plurality of communication devices including said communication device.

5. The data processing system of claim 1 wherein the enable signal is a function of a first control signal internal to the communication device and a second control signal internal to the device, the first control signal being asserted by the communication device if the communication device is functioning as a bus master and being deasserted if the communication device is functioning as a bus slave, the second control signal being in a first logic state if a read operation is occurring through the plurality of external pins and being in a second logic state if a write operation is occurring through the plurality of external pins.

6. The data processing system of claim 1 wherein a bi-directional internal bus couples the circuitry for terminating with a data unit internal to the communication device.

7. The data processing system of claim 1 wherein a bi-directional internal bus couples the circuitry for terminating with a data unit internal to the communication device wherein the data unit is a device selected from a group consisting of: a memory array containing a plurality of memories, or a central processing unit (CPU) of a data processor.

8. The data processing system of claim 1 wherein the termination component is selected from a group consisting of: a resistive device, a diode, a capacitor, a voltage source, a current source, an inductor, a transistor, and a circuit comprising one or more of the above-listed elements.

9. A data processor within an integrated circuit package comprising:

an execution unit internal to the data processor;

a plurality of external pins connected to the integrated circuit package, the plurality of external pins used to bidirectionally communicate logic bits to and from the data processor via an external bus;

a plurality of bus termination circuits, one bus termination circuit being coupled to one external pin of the plurality of external pins wherein each external pin is coupled to at least one bus termination circuit, the plurality of bus termination circuits providing data to or receiving data from the execution unit, each bus termination circuit in the plurality of bus termination circuits having an input for receiving a control signal; and a conductor coupled to each input of each of the bus termination circuits in the plurality of bus termination circuits, the conductor providing the control signal wherein the control signal, when asserted, allows each bus termination circuit in the plurality of bus termination circuits to couple at least one circuit component to the bus to reduce signal reflection on the bus, the control signal, when deasserted, allows each bus termination circuit in the plurality of bus termination circuits to decouple at least one circuit component from the bus.

10. The data processor of claim 9 wherein the at least one circuit component is a circuit component selected from a group consisting of: a capacitor, a diode, a resistor, a transistor, a voltage source, a current source, an electrical short circuit, and an inductor.

11. The data processor of claim 9 wherein the at least one circuit component is a plurality of first resistive devices wherein one first resistive device in the plurality of first resistive devices is coupled from each external pin in the plurality of external pins to a ground potential node.

12. The data processor of claim 9 wherein the at least one circuit component is a plurality of first resistive devices wherein one first resistive device in the plurality of first resistive devices is coupled from each external pin in the plurality of external pins to a power supply potential node.

13. The data processor of claim 9 wherein the at least one circuit component is a first plurality of resistive devices wherein one resistive device in the first plurality of resistive devices is coupled from each external pin in the plurality of external pins to a ground potential node and a second plurality of resistive devices wherein one resistive device in the second plurality of resistive devices is coupled from each external pin in the plurality of external pins to a power supply potential node wherein the power supply potential node is connected to receive a voltage greater than a voltage received by the ground potential node.

14. A data processor comprising:

an execution unit internal to the data processor;

a plurality of external pins used to bidirectionally communicate logic bits to and from the data processor via an external bus;

a plurality of bus termination circuits, one bus termination circuit coupled to each external pin in the plurality of external pins, the plurality of bus termination circuits providing data to or receiving data from the execution unit, each bus termination circuit in the plurality of bus termination circuits having an input for receiving a control signal; and a conductor coupled to each input of each of the bus termination circuits in the plurality of bus termination circuits, the conductor providing the control signal wherein the control signal allows each bus termination circuit in the plurality of bus termination circuits to selectively reduce signal reflection in the external bus.

15. The data processor of claim 14 wherein a circuit component is connected to the bus only when the control signal is asserted to reduce signal reflection of an incoming voltage transmission from the bus.

16. A data processing system comprising:

a master device having a dynamic bus termination circuit, the dynamic bus termination circuit being enabled when the master device is receiving data and disabled when the master device is sending data, the dynamic bus termination circuit of the master device reducing signal reflection of the data when the master device is receiving data;

a bus coupled to the master device; and a slave device coupled to the bus, the slave device having a dynamic bus termination circuit, the dynamic bus termination circuit of the slave device being enabled when the slave device is receiving data from the master device and being disabled when the slave device is sending data to the master device, the dynamic bus termination circuit of the slave device reducing signal reflection of the data when the slave device is receiving data.

17. A method for determining, via control logic within a data processor, whether to enable termination circuitry within a data processor, the method comprising the steps of:

beginning a bus transfer via a bus coupled between the data processor and a device external to the data processor;

determining whether the data processor is sending data or receiving data;

enabling the termination circuitry if the data processor is receiving data from the bus in order to reduce signal reflection on the bus; and disabling the termination circuitry if the data processor is sending data through the bus.

18. The method of claim 17 wherein the step of enabling the circuitry comprises:

enabling the termination circuitry in response to a first control signal within the data processor which is used to identify whether the data processor is a slave device or a master device and at least one second control signal within the data processor which is used to determine whether the bus is performing a read operation or a write operation.

19. A method for determining whether to enable termination circuitry within a data processor, the method comprising the steps of:

(a) determining a logic state of a control signal internal to the data processor, the logic state of the control signal determining whether data is coming in to the data processor or going out from the data processor;

(b) enabling the termination circuitry to reduce data signal reflection only if data is coming into the data processor;

(c) disabling the termination circuitry if data is being sent out from the data processor; and (d) repeating steps (a) through (c) until all the data is transferred either to or from the data processor.

20. The method of claim 19 wherein the steps (b) and (c) further comprise:

enabling and disabling the termination circuitry based upon a control signal which indicates whether the device is a master device or a slave device.

21. The method of claim 19 wherein the step (b) further comprise:

enabling the termination circuitry only for a brief time period wherein incoming data voltages are transitioning significantly within the brief period of time.

22. An integrated circuit having a terminal for communicating parallel binary data, the integrated circuit comprising:

a data unit for storing and manipulating data within the integrated circuit;

dynamic termination circuitry coupled between the data unit and the terminal for communicating parallel binary data, the dynamic termination circuitry having N physically separated termination circuits, where N is a finite positive integer greater than zero, each of the N physically separated termination circuits having at least one device wherein each at least one device: (1) provides an on/off switching capability respectively to each of the N physically separated termination circuits; and (2) is selectively used to change the impedance of the terminal for properly receiving the parallel binary data that is coming into the integrated circuit from external to the integrated circuit.

23. The integrated circuit of claim 22 wherein each of the N physically separated termination circuits are enabled via different enable signals.

24. The integrated circuit of claim 22 wherein the N physically separated termination circuits are connected in an interconnection scheme selected from the group consisting of: a parallel connection, a serial connection, a partially parallel connection, a partially serial connection, and a part-serial and part-parallel connection.

25. The integrated circuit of claim 22 wherein the N physically separated termination circuits are only enabled one at a time.

26. The integrated circuit of claim 22 wherein each of the N physically separated termination circuits are enabled at any time to provide one of a number of different termination circuit combinations wherein the different circuit combinations are equal a number selected within the range of two to $2^N$ different termination circuit combinations, the one of a number of different termination circuit combinations being coupled to the terminal for communicating the parallel binary data.

27. The integrated circuit of claim 22 wherein the impedance is selected via the at least one device to reduce signal reflection when receiving the data from the external to the integrated circuit via the terminal, the impedance being changed via the at least one device to another impedance when sending data external to the integrated circuit via the terminal.

28. A method for providing a selected impedance to a plurality of terminals of an integrated circuit, the method comprising the steps of:

determining an optimal impedance required for the plurality of terminals;

communicating at least one control signal to circuitry coupled to the plurality of terminals, the at least one control signal comprising at least one read/write signal that indicates when the integrated circuit is being subject to a read or write operation; and     providing an impedance from an output of the circuitry to the plurality of terminals wherein the impedance provided by the circuitry is the optimal impedance, the optimal impedance being one impedance among a plurality of possible impedances where each possible impedance is capable of being provided by the circuitry, the optimal impedance being selected via the at least one control signal.

29. A processor comprising:

a CPU having a plurality of external terminals where the CPU is capable of being placed into a bus master mode of operation or a bus slave mode of operation, when in the bus master mode of operation the CPU has control of an external bus coupled to the plurality of terminals and when in a bus slave mode of operation the external bus is being controlled by a device other than the CPU; and     circuitry coupled between the CPU and the external terminals for providing a selectable impedance to the plurality of external terminals in response to at least one control signal internal to the CPU, the selectable impedance being applied to the plurality of terminals: (1) when the CPU is in the bus master mode of operation and one of the at least one control signals indicates a read operation is being performed through the plurality of external terminals; and (2) when the CPU is in the bus slave mode of operation and one of the at least one control signals indicates a write operation is being performed through the plurality of external terminals.

\* \* \* \* \*

(12) EX PARTE REEXAMINATION CERTIFICATE (8670th)

United States Patent
Gay et al.

(10) Number: US 5,467,455 C1
(45) Certificate Issued: Nov. 22, 2011

(54) DATA PROCESSING SYSTEM AND METHOD FOR PERFORMING DYNAMIC BUS TERMINATION

(75) Inventors: James G. Gay, Pflugerville, TX (US); William B. Ledbetter, Jr., Austin, TX (US)

(73) Assignee: Citibank, New York, NY (US)

Reexamination Request:
No. 90/011,664, Apr. 29, 2011

Reexamination Certificate for:
Patent No.: 5,467,455
Issued: Nov. 14, 1995
Appl. No.: 08/145,117
Filed: Nov. 3, 1993

(51) Int. Cl.
*H03H 7/40* (2006.01)
*H03H 7/38* (2006.01)

(52) U.S. Cl. .................. 710/100; 326/30; 333/17.3; 333/32; 710/2

(58) Field of Classification Search .................. 395/325
See application file for complete search history.

(56) References Cited

To view the complete listing of prior art documents cited during the proceeding for Reexamination Control Number 90/011,664, please refer to the USPTO's public Patent Application Information Retrieval (PAIR) system under the Display References tab.

*Primary Examiner*—Mary Steelman (57) ABSTRACT

A data processing system and a method for performing dynamic bus signal termination uses a dynamic bus termination circuitry (14 or 16) with a device (10 or 12). The circuitry is enabled when data is incoming to the device and is disabled when data is outgoing from the device to selectively reduce unwanted signal reflection at the signal end of a bi-directional bus (17). The disabling allows the circuitry to be removed or tristated from any connection with the bus (17) when not needed (i.e., data outgoing) to reduce loading. The disabling of the termination circuitry also aids in reducing the power consumption of the part when either the bus is sitting idle or the part is in a low power mode of operation.

EX PARTE REEXAMINATION CERTIFICATE ISSUED UNDER 35 U.S.C. 307

NO AMENDMENTS HAVE BEEN MADE TO THE PATENT

AS A RESULT OF REEXAMINATION, IT HAS BEEN DETERMINED THAT:

The patentability of claims 1, 8, 9, 22, 24 and 26 is confirmed.

Claims 2-7, 10-21, 23, 25 and 27-29 were not reexamined.

* * * * *